(12) United States Patent
Chin

(10) Patent No.: US 6,691,268 B1
(45) Date of Patent: Feb. 10, 2004

(54) METHOD AND APPARATUS FOR SWAPPING STATE DATA WITH SCAN CELLS

(75) Inventor: Douglas Chin, Haverhill, MA (US)

(73) Assignee: Oak Technology, Inc., Sunnyvale, CA (US)

( * ) Notice: Subject to any disclaimer, the term of this patent is extended or adjusted under 35 U.S.C. 154(b) by 586 days.

(21) Appl. No.: 09/607,775

(22) Filed: Jun. 30, 2000

(51) Int. Cl.[7] ............................................... G01R 31/28
(52) U.S. Cl. .................... 714/726; 714/30; 714/727; 326/47; 716/16; 716/17; 716/8
(58) Field of Search .................... 714/726, 30, 727, 714/729, 733; 709/215, 208, 228, 230; 370/433, 458, 465, 476, 552; 716/16, 17, 8; 326/47

(56) References Cited

U.S. PATENT DOCUMENTS 5,218,680 A * 6/1993 Farrell et al. ............... 709/215
6,134,517 A * 10/2000 Baxter et al. ............... 703/28
6,226,779 B1 * 5/2001 Baxter et al. ............... 716/16
6,289,477 B1 * 9/2001 Gunadisastra ............... 714/724
6,374,380 B1 * 4/2002 Sim ............................ 714/727

* cited by examiner

Primary Examiner—Emmanuel L. Moise
(74) Attorney, Agent, or Firm—Kudirka & Jobse, LLP

(57) ABSTRACT

An enhanced scan chain architecture includes scan cells capable of holding two sets of state data associated with the functional blocks, or "modules," of a system (e.g., an integrated circuit, a multi-chip module, a printed circuit board, and the like), thereby rendering state data associated with a module accessible. The scan chains are employed, during normal operation, to manage (e.g., save, restore, swap, etc.) state data during multi-tasking and/or testing. Control logic redirects the input of the chain, or selected portions thereof, to a source of saved state when initiating or restoring a task; and/or redirects the output of the chain, or selected portions thereof, to a storage source when one task is interrupted and/or another task is resumed.

11 Claims, 9 Drawing Sheets

METHOD AND APPARATUS FOR SWAPPING STATE DATA WITH SCAN CELLS

CROSS REFERENCE TO RELATED APPLICATIONS

This application is one of two related applications filed on an even date herewith and commonly assigned, the subject matters of which are incorporated herein by reference for all purposes, including U.S. patent application, Ser. No. 09/607, 899, entitled, "A Method And Apparatus For Managing State Data With Scan Chain Logic," by Douglas Chin, Attorney Docket No. PA-1170 US1.

FIELD OF THE INVENTION

This invention relates to managing state data, and more particularly, to a method and apparatus which uses an enhanced scan cell to swap state data in an electronic or other computational system, primarily for multi-tasking purposes.

BACKGROUND OF THE INVENTION

In an electronic system, or other computational system, it is sometimes advantageous for cost, size, or other reasons to simultaneously process multiple tasks. As used herein, the term "task" refers to the collection of operations, or pieces, necessary to complete a particular process (e.g., decoding an incoming facsimile image). The terms "electronic system" or "computational system" or "system," as used herein, covers a wide variety of devices that are recognized by those skilled in the art including, but not limited to, integrated circuit (ICs), hybrids, and multi-chip modules (MCMs). The term also includes printed circuit boards (PCBs), subsystems, and combinations of PCBs and/or subsystems.

The appearance of executing more than one task at the same time in a single system is known as "multi-tasking." Multi-tasking is accomplished by dividing two or more tasks into smaller, manageable pieces, and then, interspersing the processing of the pieces. By quickly switching from the pieces of one task (e.g., when it is made inactive or suspended) to the pieces of another task (e.g., when it is made active, initiated, or resumed), an appearance of simultaneous task execution is created.

The ultimate goal of multi-tasking is to fully utilize the capabilities of a system by preventing long periods of idle time where no useful processing is occurring due to a lack of data, and/or commands, or user input. An additional reason for multi-tasking is the fact that a minimal hardware implementation of an algorithm may provide far more processing bandwidth than a single task requires. Without multi-tasking, this bandwidth is wasted and the hardware is under-utilized. For example, without multi-tasking, a system that requires the appearance of simultaneously executing two tasks would require two processors, even though a single processor could be built to have enough bandwidth to process both tasks in the necessary time. In some cases, the processor needed would be the minimal implementation and require no modification and in other cases, the processor would require some speed improvements but would still be substantially smaller and cheaper than having two smaller processors.

For maximum efficiency, a system must have the ability to switch tasks at any time; this is known as a "preemptive multi-tasking." For example, consider an image processing device (IPD) working on a first task, such as decoding an incoming facsimile image. In an ideal system, the IPD decodes the incoming image until an information transfer is required—i.e., once the IPD decodes all of the information that is currently available for that incoming image. Then, right-away, the IPD switches to working on a second task, perhaps processing a scanned-in image, while the information transfer takes place. After receiving more information for the first task, the IPD then immediately switches back to working on the first task where it left off. The IPD continues to switch between the two tasks whenever an information transfer is required until both tasks are completed. Thus, a preemptive, or unrestrained, multi-tasking system makes better use of its processing devices by immediately switching between tasks according to the availability of information.

Often, however, task switching requires the storage of the context (i.e., the state data) of a system, or of a functional block therein (e.g., a partition of logic internal to an IC), at the end of processing a piece of one task; and the retrieval of context information at the beginning of processing a piece of a resumed task. This introduces a bottleneck for multi-tasking systems because of the time and overhead required to manage state information (i.e., saving/restoring state data) for the individual pieces of multiple tasks. Furthermore, this problem is exasperated in complex systems that have unexposed functional blocks, such as logic buried in an IC, because of the limited access to the internal state data therein. For example, the PM-22 IC from Pixel Magic, Inc., contains an input pipeline, a JBIG pre-processing pipeline, and a JBIG decoder pipeline, wherein the first two pipelines affect the state data for the JBIG decoder pipeline. Although some of the state date in these pipelines can be read when saving the state of a piece of a task, much of the internal logic for the JBIG decoder pipeline is not exposed (e.g., it is buried within the IC), and thus, during multi-tasking the state data therein is not directly accessible.

A prior art solution for restoring the appropriate state data for a resumed task is to replay the previously saved input data to the JBIG decoder pipeline (i.e., the unexposed functional block), and then, wait for the decoder to regenerate the missing state data. Adding to the difficulty of this procedure is the fact that, when resuming a task, the state data in the input and pre-processing pipelines usually is not the input byte sequence needed to regenerate the state data in the JBIG decoder pipeline. Thus, to regenerate the correct state data to resume a task, all of the pipelines need to first be primed, which requires numerous, time-consuming calculations.

To coordinate these complex calculations, one prior art solution restrains task switching to specific "boundaries," and thus, does not allow preemptive multi-tasking. For example, an application employing the PM-22 IC to process images, programs the IC to stop processing an image at the end of a predetermined line, or a "line boundary," as if it was the end of the image. Next, the application prompts the IC to save the accessible state data, and then, to switch to a different image for processing.

In operation, the IC processes a first piece of a first task, such as decoding a first image up until a particular line boundary for the first image. Then, the IC saves the resulting, accessible state data at the end of the first piece of the first task. Next, the IC begins to process a first piece of a second task, such as decoding a second image up until a predetermined line boundary for the second image. Again, the IC saves the resulting, accessible state data at the end of the first piece of the second task.

To switch back to the first task and resume decoding the first image, the application must prompt the IC to restart its decoder at the line boundary where it stopped decoding the first image. In order to do this, however, the application must first restore the previously saved state data—i.e., the accessible state data that resulted after the first piece of the first task was processed—to the IC's decoder. Then, the application must wait for the decoder to regenerate the appropriate state data by processing the previously saved state data that was accessible at the time the first task was suspended.

Requiring task switching to occur on line boundaries is annoying from a multitasking standpoint because it does not allow the application to task switch in reaction to an event. Moreover, requiring tasks to switch on specific boundaries does not fully utilize the capabilities of a system. Furthermore, system memory is reduced and/or additional hardware (e.g., registers), system control, and CPU intervention (e.g., from a coupled host) is required for storing/restoring state data for the pieces of the multiple tasks. Thus, it is highly desirable to expose more of. a system's functional blocks, or modules, so that state data can be managed more efficiently during multi-tasking.

During the manufacturing process of a system, the exposure and accessibility of state data is also of interest for testing and debugging. This is especially true with regard to today's complex ICs, many of which have multi-tasking capabilities. Often, the clues to system problems are found in the states of functional blocks within an IC. This requires the determination of the proper operation of an IC's internal logic, such as each internal cell (e.g., a flip-flop). The ability to control the states of these cells helps debug other parts of the system by setting up a known condition for input to the functional block of interest.

To improve the exposure of the functional blocks of a system, many designers follow the IEEE specification 1149.1, also referred to as the JTAG specification. This commonly used specification sets out a standard for a scan chain logic architecture which enables verification of dense, complex systems while minimizing the number of external test pins.

Scan chain logic provides access to the cells of an entire IC, or a functional block therein, via a single, Scan_Input input pin at one end, and a single, Scan_Output output pin at the other end. By connecting the output of one scan cell (e.g., a flip-flop) to the input of another, a chain is created through a functional block therein. The chain may be employed for testing via control pin(s) which are connected to each scan cell.

By asserting the control pin(s), state data can be loaded into the scan cells, unloaded from the scan cells, and/or serially shifted around the chain, from the Scan_Input pin to the Scan_Output pin. Such state data manipulation allows for the monitoring of a system to detect and pinpoint design and manufacturing defects. Furthermore, since the JTAG specification is a widely followed standard, it is easy to implement a scan chain logic architecture into a design.

In fact, today a scan chain logic architecture can be automatically integrated into a system using electronic design automation (EDA) tools, computer aided design (CAD) tools, computer aided engineering (CAE) tools, and data formats such as the Boundary-Scan Description Language. These tools automate the creation of a scan chain logic architecture into a design in accordance with user-specified design constraints (e.g., requirements for fan-out, fan-in, set-up time, hold time, and other design parameters). Additionally, these tools efficiently connect and route the scan cells (e.g., flip-flops) of a scan chain logic architecture.

Because both multi-tasking and scan chain logic are common in today's systems, it would be beneficial and efficient for cost, design time, and functionality purposes to implement and enhance multi-tasking by managing state data with an enhanced scan chain logic architecture.

SUMMARY OF THE INVENTION

The present invention proposes use of enhanced scan chain logic in a processor to improve multitasking and testability. A major portion of the state of a processing module is composed of the states of all the flip-flops in the module. By implementing each state flip-flop as a scan cell containing an active flip-flop and a scan flip-flop, task state switching can be accomplished in a single clock cycle by swapping the contents of the two flip-flops. After one state swap and before the next, the state information from the task that was suspended by the last swap is shifted out of the scan flip-flops as the state information for the next task to run is shifted in. The use of scan logic also greatly improves testability of the module.

To further simplify and clean up the multitasking process, the functional blocks of a device may be made distinct to allow only specific blocks to be saved and restored. Mechanisms can be provided to allow state information to be saved and restored to either an attached local SRAM or, through a DMA interface, to main system memory. State data may also be saved by allowing the control application to read the state data through a register interface.

In an integrated circuit containing multiple processing modules, to minimize the amount of state data being manipulated, saving and restoring state is controllable on a module by module basis through the multitasking register. The inventive design eliminates the need to save and restore the state of modules that are not being used. This is particularly useful because the operation of some modules is mutually exclusive.

In the present invention, at the chip or integrated circuit level, the modules are connected into a chain to allow data to be shifted into the chip serially through the first module in the chain and to allow data to be shifted out of the chip serially through the last module in the chain. The ability to selectively save and restore module state data on a module by module basis is implemented by logic in each module that discards, without outputting, the module's state if it is not being saved and routes data being shifted into the module around the module's scan chain if the module is not being restored.

Saving and restoring state in each module is accomplished through enhanced scan chain logic. Each module is implemented with special flip flops that actually contain scan chain logic. The chains in each module are kept distinct to allow individual modules to be saved and restored. Each module's chain is extended to a multiple of 16 bits in length to make the bit alignment of data within words independent of the collection of modules being saved.

Each enhanced scan flip flop is composed of an active flip flop, a scan flip flop, and some multiplexing logic for control. In addition to the normal Data_In, Clock and Data_Out connections of a normal flip flop, the scan cell also has a Scan_Input, a Scan_Output, and two scan control signals, Shift and Swap.

When the Swap control signal is high on the rising edge of clock, the data in the active flip flop is exchanged with the data in the scan flip flop. This exchange is used to swap the current state of the active flip flop with the state to be restored which should be in the scan flip flop. When the Swap control signal is low, the active flip flop behaves as a normal positive edge triggered flip flop and the function of the scan flip flop is governed by the Shift control signal. When the Shift signal is high during the rising edge of Clock, the data on Scan_Input is shifted into the scan flip flop. When the Shift signal is low, the state of the scan flip flop does not change. With the exception of the first and last scan cells in each module's chain, the Scan_Output of each scan cell in a module is connected to the Scan_Input of another flip flop in the same module. The Clock signals of all scan cells are connected to the chip's clock distribution tree.

The module level control logic deals with the scan chain through only a few signals. All data being fed to a module's scan chain is loaded in through the Scan_In input which is connected to the Scan_Input of the first scan cell in the module's chain through the module level control logic. All the data in the module's scan chain is read out through its Scan_out output which is internally connected to the Scan_Output of the last scan cell in the chain through the module level control logic. The Swap control signals of all the module's cells are connected in parallel, as are all the Shift signals in the module. The management of scan data at the module level is accomplished through a standardized module control logic interface consisting of the following signals: Scan_In, Scan_In_Enable, Scan_In_Ready, Scan_Out, Scan_Out_Enable, Scan_Out_Ready, Swap, Enable, Reset_Count, Save, and Restore.

Each module enable can be controlled independently through bits in the Master Enable Register. The state of each module's Save and Restore signals can be controlled independently through the Multi-tasking Control Register. Through the Multi-tasking Control Logic the application can generate appropriately timed pulses for the Swap and Reset_Count signals of all modules.

Scan_In is a module input that is connected to the Scan_Input signal of the first scan cell in the module's chain of scan cells. This input is connected to the Scan_Out of the previous module if one exists or to the Chip's source of scan data otherwise.

Scan_In_Enable is an input that indicates to the module when valid data can be shifted into the module. Data is considered to be shifted into the module whenever there is a rising edge of the core clock, this signal is asserted, and the module is asserting Scan_In_Ready. Scan_In_Enable is connected to the Scan_Out_Ready of the previous module if it exists. Otherwise, it is connected to a signal in the Chip's scan logic that indicates the availability of scan data.

Scan_In_Ready is a module output that indicates that the module is now ready to take input data. This signal is asserted when the module is in the process of discarding its own state. A module discards its own state when Save is not asserted and Restore is. Asserting Scan_In_Ready in this situation allows the data to be restored to shift be shifted into the module. While the module is not discarding its state data Scan_In_Ready is logically connected to the module's Scan_Out_Enable signal. The Scan_In_Ready signal of each module is connected to the Scan_Out_Enable of the previous module if it exists. Otherwise, it is connected to the logic that loads the scan data.

Scan_Out is a module output that is logically connected to Scan_Output of the last scan cell in the module's chain of scan cells if Restore is asserted or to the module's Scan_In input if Restore is not asserted. This signal is connected to the Scan_In of the next module in the module chain if one exists or to the logic that saves the state information otherwise.

Scan_Out_Enable is a module input that indicates to the module that scan data can now be output. Data is considered to be shifted out of the module whenever there is a rising edge of the core clock, this signal is asserted and the module is asserting Scan_Out_Ready. Scan_Out_Enable is connected to the Scan_In_Ready of the next module in the chain if it exists or to the logic that saves the scan data otherwise.

Scan_Out_Ready is a module output that indicates that the module is ready to output data. It is de-asserted while the module is in the process of discarding its state because Save is not asserted. When module state is not being discarded, Scan_Out_Ready is logically connected to Scan_In_Enable. Scan_Out_Ready is connected to the Scan_In_Enable of the next module in the chain if it exists or to the logic that saves the scan data otherwise.

Swap is a module input that is connected to the Swap inputs of all the scan cells in the module. When asserted during the rising edge of the core clock, the state of each active flip flop is exchanged with the state in the scan flip flop. This signal is connected to the logic that determines when to swap states.

Enable is a module input that controls processing within the module. When asserted, the module will perform its normal operation. When deasserted, the module will finish all currently active transactions with other modules and deassert all requests for new transactions, thus making it safe to save, swap, or restore state. The implementation of this within each module is module dependent. It is this signal that prevents multi clock cycle transactions from being interrupted and restarted out of context. The Enable signal of each module is connected to a separate bit in the master enable control register. Reset_Count is a module input that, when asserted on the rising edge of a core clock, resets the module's shift count. This count is used to determine how many bits to discard when not saving and restoring the module's state at the same time. Save is a module input that, when asserted, allows the module's state to be saved. When this signal is not asserted, the module's state is not included in the data shifted through the module. The Save signal of each module is connected to a separate bit in the multitasking control register.

Restore is a module input that, when asserted, allows the module's state to be restored. When this signal is not asserted, data shifted into the module's Scan_In signal is sent directly to the module's Scan_Out instead of through the module's scan chain. The Restore signal of each module is connected to a separate bit in the multitasking control register.

Under normal operation, which is defined as shifting data through the module, the module's Scan_Out_Ready signal is logically connected to its Scan_In_Enable signal, its Scan_In_Ready signal is logically connected to its Scan_Out_Enable signal, and the Scan_Out signal is connected to the Scan_Output of the last Scan Cell in the module's chain of Scan Cells. This allows data to be shifted through the module whenever both the data source and destination are ready. When a module's state is either not being saved or not being restored, data is discarded or not loaded into the module by manipulating the Scan_Out_Ready and Scan_In_Ready signals and the source of Scan_Out data while shifting, as described below.

Although most of the time the module's Scan_In is logically connected to first scan cell's Scan_Input, this is not the case for when the module's data is being discarded because it was not in use before the last swap. If a module was not in use before the last swap and will not be in use after the next swap, the application, i.e. the process controlling use of the module, must set the Save and Restore signals for the module inactive. This causes the output scan control signals to be logically connected to the input scan control signals to cause scan data to flow around the module.

If a module was not in use before the last swap and will not be in use after the next swap, the application must de-assert the Save and Restore signals while shifting state data. This causes the output scan control signals to be logically connected to the input scan control signals to cause scan data to flow around the module.

If a module was not in use before the last swap and will be in use after the next swap, the application must de-assert the Save signal and assert the Restore signal while shifting state data. This causes the module's state to be discarded by de-asserting the Scan_Out_Ready signal and asserting the Scan_In_Ready signal until a module's worth of data has been shifted in. After the state data has been discarded, normal shift operation is resumed.

If a module was being used before the last swap and will not be in use after the next swap, the application must assert the Save signal and de-assert the Restore signal while shifting state data. This causes the module's state data to be saved without shifting in new state by asserting the Scan_Out_Ready signal and deasserting the Scan_In_Ready signal until a module's worth of data has been shifted out. After the state data has been saved, normal shift control is resumed but Scan_Out data is taken directly from Scan_In to prevent data destined for other modules from being lost in the module.

If a module was being used before the last swap and will still be used after the next swap, the application must set the Save and Restore signals active. This configures normal module operation as described above and the existing state will be saved while a new state is shifted in.

To swap tasks, the application first deasserts the Eenable signals of all the modules. This causes them to stop processing data and, consequently, allows any state machines that are in the middle of multi-clock interactions with other modules to finish. Then, the application selects the modules to be saved and restored by programming the multitasking control register with an appropriate value. Then, by writing to a special register location, the Swap and ResetMultitaskCount signals are asserted for one clock cycle to cause the active data to be swapped with the data from the task to be restored and to reset the module bit counters. With the state of the task to be restored now in the part, the application starts the task processing by writing the appropriate bit pattern to the enable register. While the restored task is processing data, the state of the next operation to restore is then shifted into the Scan_In signal of the first module in the chain and the data to be saved from the task that was just interrupted is shifted out from the Scan_Out signal of the last module in the chain.

By shifting in data to be restored at the next state swap and shifting out data from the last swap at the same time, a save and a restore operation occur simultaneously. Although this is the most time efficient manner of swapping state, there may be times where the task to invoke at the next swap is not know when saving the state from the last swap. In this case, it is also possible to save the state from the last swap and then restore the state for the next swap. This is done by programming the multitasking control register to save the required state without restoring any state. After the state save has completed, the application restores the needed state by writing to a special register that causes the multitasking counters to be reset. It then configures the multitasking control register for the state restore and loads the data into the part.

Two methods of saving and restoring state data are provided. The application can perform a Direct Memory Access of data to or from a module or the module can use its dedicated SRAM for storage, such activities being controlled by registers in the module.

According to a first aspect of the present invention, a scan cell for storing state data associated with more than on task comprises a data memory device configured to hold state data and having a data input terminal, a data output terminal, and a control input terminal; a scan memory device configured to hold state data and having a scan input terminal, a scan output terminal, and the control input terminal; and control logic coupled to the data memory device and the scan memory device and configured to initiate swapping of the state data in the data memory device with the state data in the scan memory device upon a predetermined event.

According to a second aspect of the present invention, a scan chain comprises a plurality of scan cells, each scan cell having first and second memory devices capable of holding data and interconnected to allow swapping of data between the memory devices, the plurality of scan cells being serially interconnected to enable propagation of data sequentially through the first memory devices of the scan cells; the plurality of scan cells being serially interconnected to enable propagation of data sequentially through the second memory devices of the scan cells; and control logic configured to initiate swapping of the data between the first and second memory devices upon the occurrence of a predetermined event.

According to a third aspect of the present invention, a method for managing state data in a system having a scan chain, the scan chain being configured to hold state data associated with a module of the system, the scan chain comprising a plurality of scan cells, the scan cells comprising data memory device and scan memory devices, the method comprising: (A) receiving a swap signal at a control input terminal of the scan cells; (B) swapping, in response to the swap signal, state data in the data memory device of each scan cell with state data in the scan memory device of each scan cell; (C) saving the state data from the scan memory device a each scan cell to a storage source; and (D) loading new state data into the scan memory device of each scan cell.

BRIEF DESCRIPTION OF THE DRAWINGS

The above and further advantages of the invention may be better understood by referring to the following description in conjunction with the accompanying drawings in which.

DETAILED DESCRIPTION

In order to illustrate the following embodiments of the present invention, various terms are used throughout the specification. As used herein, the term "assert," and various grammatical forms thereof, refers to a logic signal or input/output being in an active, or logically true, state (e.g., 1). As used herein, the term "de-assert," and various grammatical forms thereof, refers to a logic signal or input/output being in an inactive, or logically false, state (e.g., 0). As used herein, the phrase "rising edge" refers to the Clock signal or a Clock input reaching a predetermined threshold voltage while transitioning from a logically false state to a logically true state. As used herein, the phrase "glue logic," refers to synchronous logic, asynchronous logic, and combinations of both synchronous and asynchronous logic.

Figure 1:
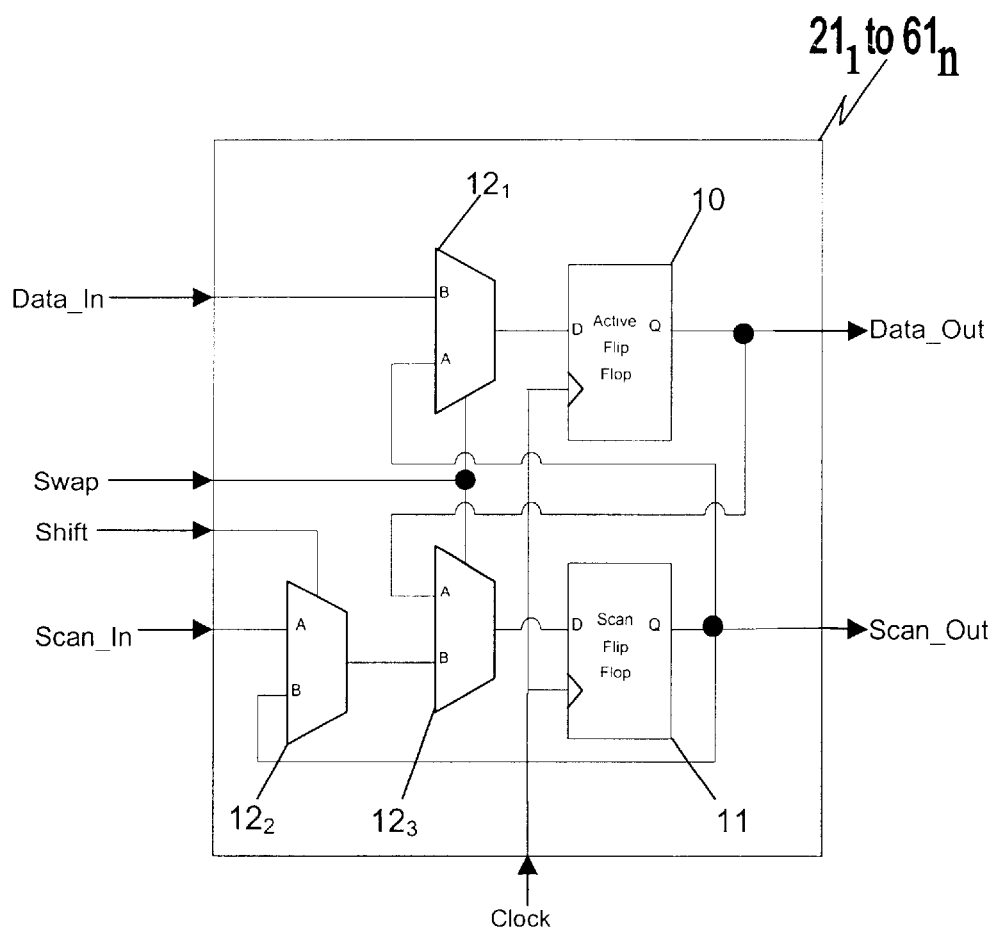
FIG. 1 is a block diagram of an illustrative embodiment of an individual scan cell for the present invention.

The invention improves multi-tasking and testability in a system by employing enhanced scan chain logic, wherein scan cells are coupled together so as to better expose the functional blocks, or "modules,"of a system. Beginning at the lowest level, FIG. 1 illustrates a proposed configuration for an individual enhanced scan cell, which in the illustrative embodiment is employed for constructing a chain of enhanced scan cells so as to form an enhanced scan chain logic architecture. The enhanced scan cell includes an active D flip-flop 10, or other memory device, a scan D flip-flop 11, or other memory device, and multiplexing logic 12, to 123 for control. In addition to the normal Data_In input, Clock input, and Data_Out output of a normal D flip-flop, the enhanced scan cell also has a Scan_Input input, a Scan_Output output, and two control inputs, Swap and Shift.

Figure 1A:
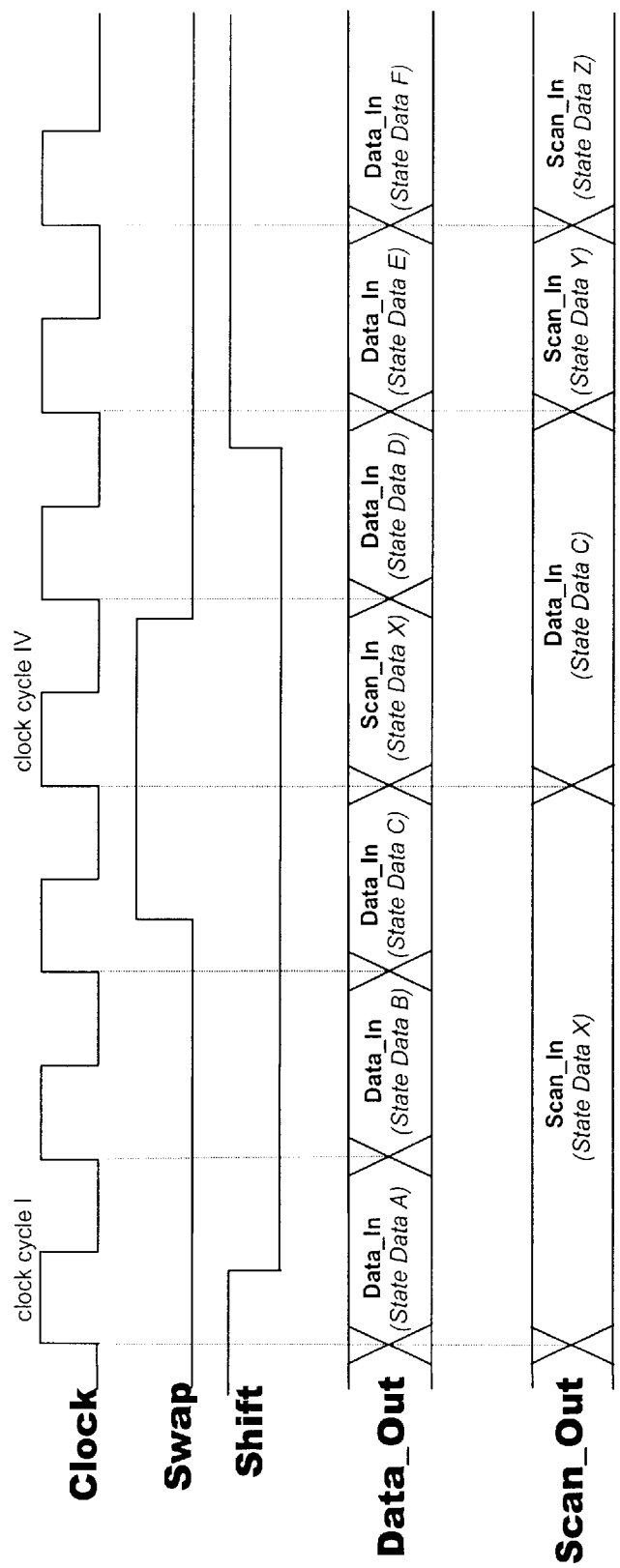
FIG. 1A is a timing diagram illustrating the relationship of the inputs and outputs of the scan cell shown in FIG. 1.

Referring now to FIG. 1A, a timing diagram illustrates the relationship between the inputs and outputs of the scan cell of FIG. 1. As illustrated by clock cycle IV, when the Swap input is asserted and there is a rising edge at the Clock input, the state data in the active D flip-flop 10 (i.e., State Data C) is exchanged with the state data in the scan D flip-flop 11 (i.e., State Data X). This exchange is used to swap the current state of the active D flip-flop 10 with the state to be restored, which should be in the scan D flip-flop 11. When the Swap input is de-asserted, the active D flip-flop 10 behaves as a normal positive edge triggered D flip-flop, and the function of the scan D flip-flop 11 is governed by the Shift input. When the Shift input is asserted and there is a rising edge at the Clock input, the state data at the Scan_in input is shifted into the scan D flip-flop 11. When the Shift input is de-asserted, the state data of the scan D flip-flop 11 does not change.

The scan cell depicted by FIGS. 1 and 1A is presented only to provide an understanding of the inventive concepts. As will be apparent to those skilled in the art, different types and/or quantities of flip-flops, and/or additional circuitry, may be employed which will achieve some of the advantages of the invention without departing from the spirit and scope of the invention. For example, instead of only one active D flip-flop 10, multiple active D flip-flops may be employed for a scan cell; likewise, multiple scan D flip-flops may be employed for a scan cell.

Figure 2:
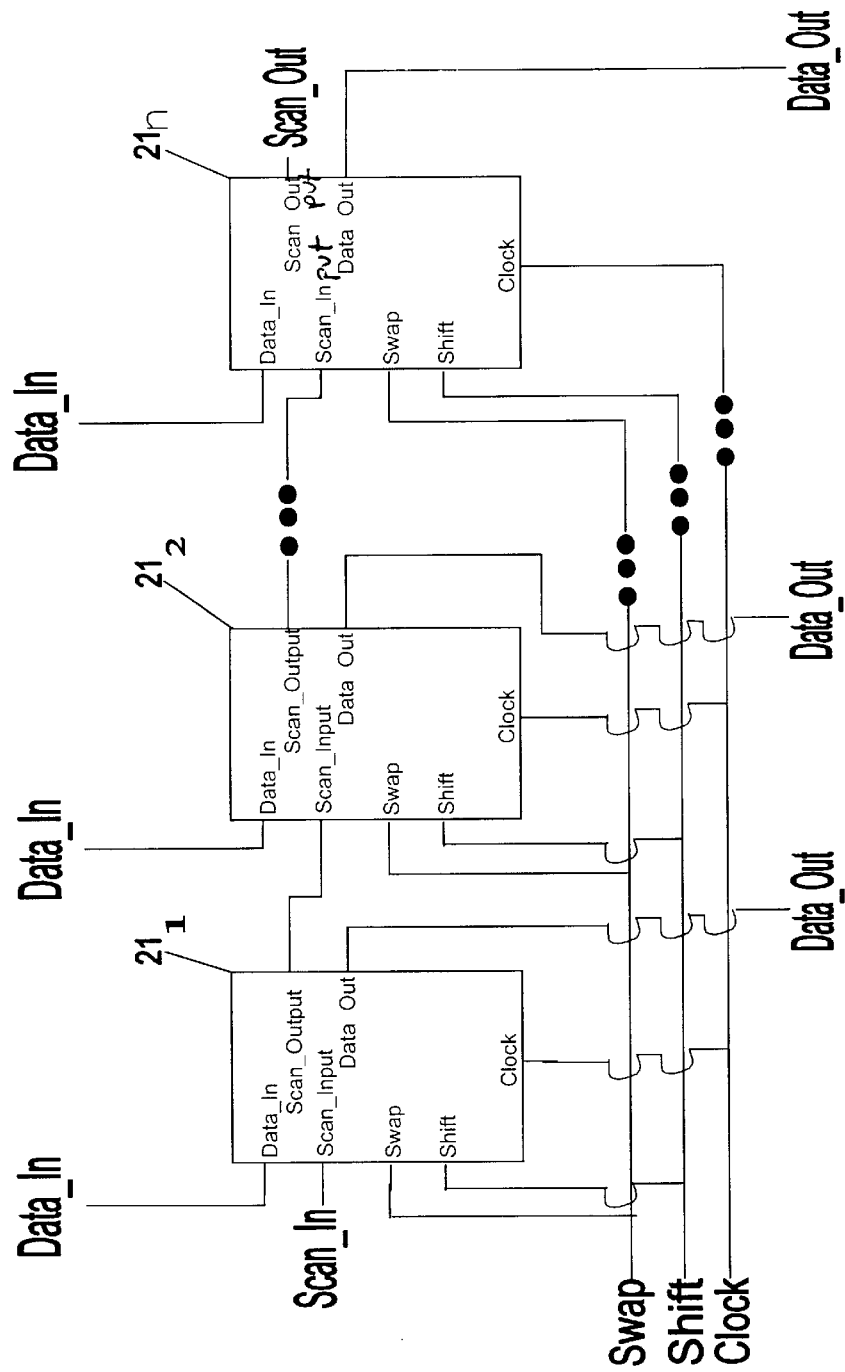
FIG. 2 is a block diagram illustrating the connections of individual scan cells which result in a chain of scan cells.

FIG. 2 depicts conceptually the connections between individual scan cells that result in a chain of scan cells $21_1$, to $21_n$. The chain of scan cells $21_1$, to $21_n$, hereinafter referred to as "Chain I $21_1$ to $21_n$," is configured such that the Scan_In input of the first scan cell $21_1$ is connected to a Scan_In of the accompanying control module logic interface which is, in turn, coupled to a primary input. As is familiar to those skilled in the art, a "primary input" may be a pin lead for an integrated circuit (IC), or a pin lead for a multi-chip module (MCM), or a connector pin for a printed circuit board (PCB), or the like. The Scan_Out output of the last scan cell $21_n$ may be connected to a primary output. As is familiar to those skilled in the art, a "primary output" may be a pin lead for an IC, or a pin lead for an MCM, or a connector pin for a PCB, or the like. Although not shown in FIG. 2, the module level Scan_In signal is actually connected to the Scan_Input of the first cell through the module control logic interface. The same is true of the output side.

Figure 2A:
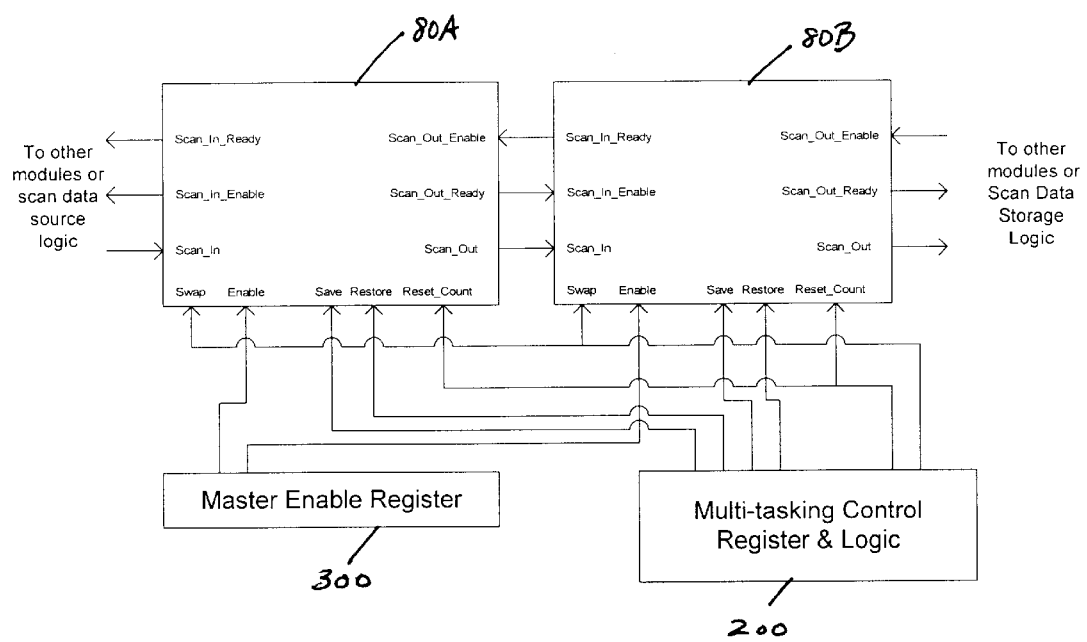
FIG. 2A is a block diagram illustrating the module level control logic and the connections to the individual scan chains.

FIG. 2A illustrates conceptually two module control logic interfaces 80A and 80B and the connections to the master enable control register 300 and multi-tasking control register 200. A scan chain (not shown) would be interposed between two module control logic interfaces 80A and 80B, with module control logic interface 80A providing the Scan_Input and control signals to the scan chain. The Scan_Output of the scan chain would be connected to the Scan_input of module control logic interface 80B, as illustrated conceptually in FIG. 3. The actual logic components used to implement module control logic interface 80 may be left to the discretion of the system designer, given the functional description of the interface and the signal connection described herein.

Figure 3:
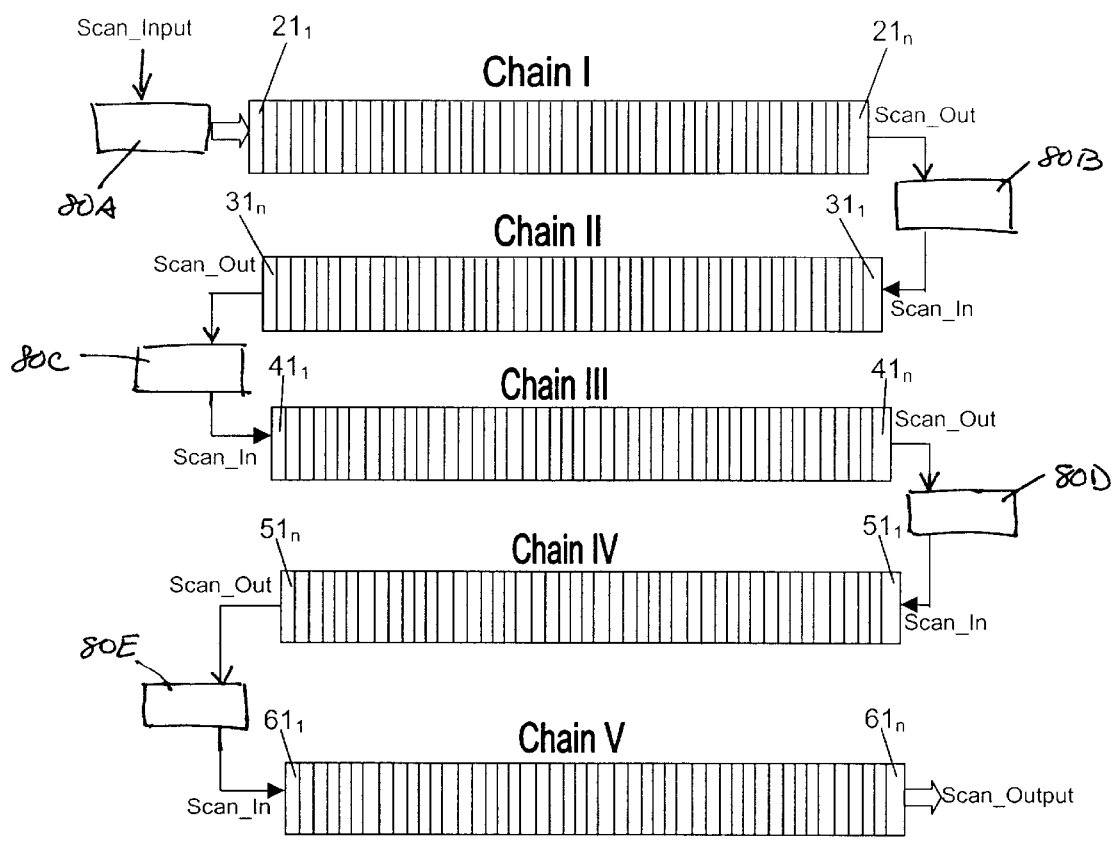
FIG. 3 is a block diagram illustrating the connections of five chains of scan cells.

Referring now to FIG. 3, an entire chain of scan cells $21_1$ to $61_n$ is illustrated, wherein the entire chain of scan cells $21_1$ to $61_n$ includes: Chain I $21_1$ to $21_n$; Chain II $31_1$ to $31_n$, Chain III $41_1$ to $41_n$; Chain IV $51_1$ to $51_n$; and Chain V $61_1$ to $61_n$. With the exception of the first scan cell $21_1$ and the last scan cell $61_n$, the Scan_Output of each individual scan cell is connected to the Scan_Input of the next scan cell which follows it in the chain. For example, as illustrated by FIG. 2, the Scan_Out output of the first scan cell $21_1$ is connected to the Scan_Input of the second scan cell $21_2$. The Clock input of each scan cell is connected to a common Clock signal. The Swap input of each scan cell is connected in parallel, as is the Shift input. In the illustrative embodiment, and as depicted by FIG. 3, however, the Scan_Out output of the last scan cell $21_n$ of Chain I $21_1$ to $21_n$ is connected to the Scan_In input of the first scan cell $31_1$ of Chain II $31_n$ to $31_n$. In the illustrative embodiment, and as depicted by FIG. 3, however, the Scan_Out output of the last scan cell $21_n$ of Chain I $21_1$ to $21_n$ is connected to the Scan_In input of the first scan cell $31_1$ of Chain II $31_1$ to $31_n$.

Figure 4:
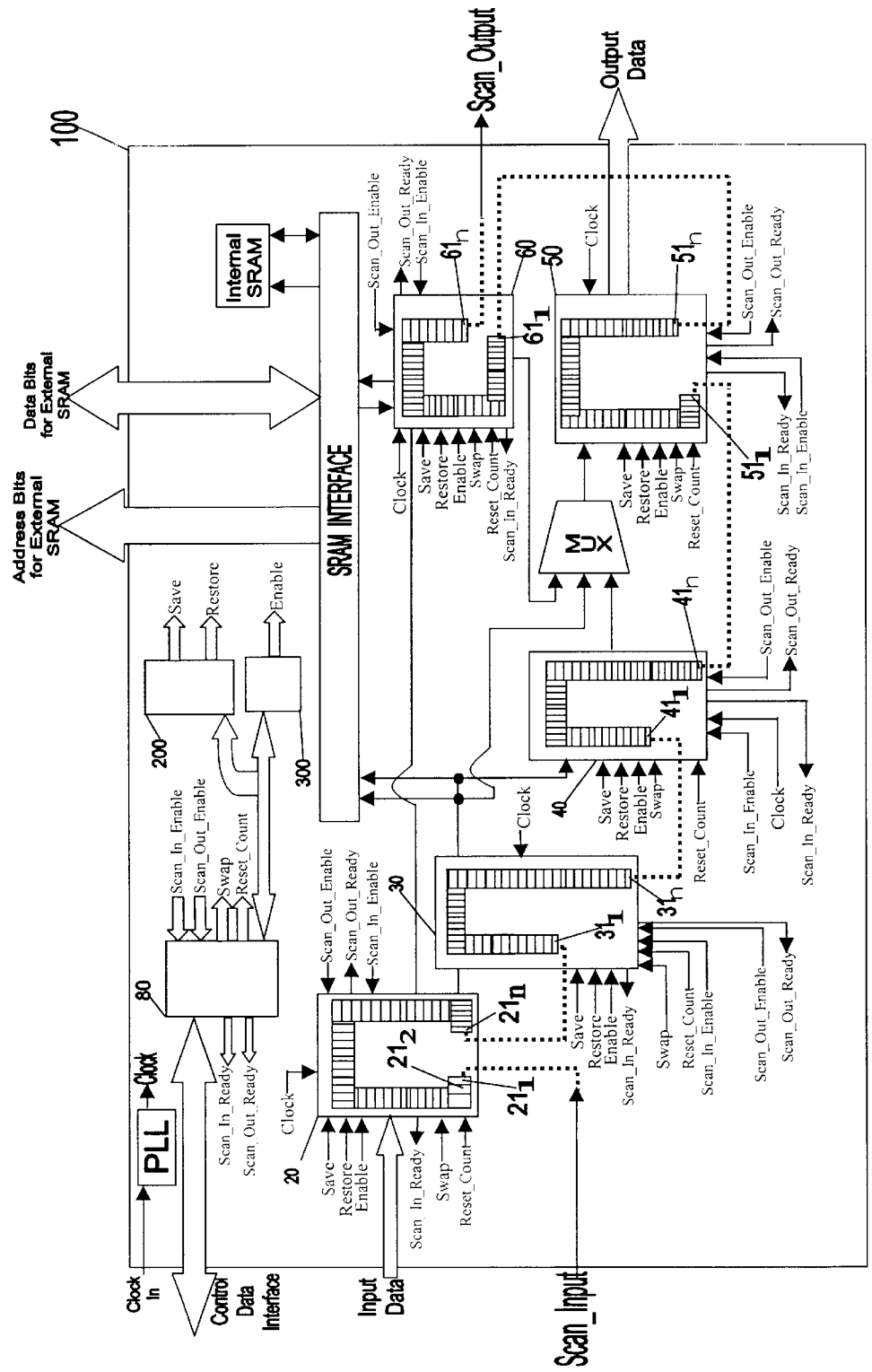
FIG. 4 is a block diagram depicting an "IC-level" block diagram of the inventive concept as implemented in an image processing device.

FIG. 4 illustrates an "IC-level" block diagram of the architecture of an exemplary processing system, such as a high-speed image processing device (IPD) from the PM-2x family of ICs commercially available from Oak Imaging, Andover, Mass. The IC 100 is made up of functional blocks, hereinafter referred to as "modules," which perform specific tasks. For this illustrative embodiment, the modules of particular interest include an input module 20, an output module 50, a Huffman encoder module 40, a Huffman decoder module 30, and a JBIG codec module 60. These modules 20 to 60 may be implemented with hardware, software, and/or firmware, as is familiar to those skilled in the art. More information regarding these modules 20 to 70, can be found in the User's Guide for the PM-2x family of ICs from Oak Imaging, Inc., which is incorporated herein for reference. It should be noted that the IC 100 of FIG. 4 is discussed only for descriptive purposes, and should not be considered a limitation of the inventive concept.

As depicted in FIG. 4, the IC 100 includes enhanced scan chain logic which includes a chain of scan cells $21_1$ to $61_n$, as previously discussed with regards to FIGS. 1, 1A, 2, and 3. The IC 100 is designed and fabricated so that the entire chain of scan cells $21_1$ to $61_n$ is divided into five separate chains, as depicted by FIG. 3. Each chain exposes an associated module within the IC 100, wherein: Chain I $21_1$ to $21_n$ exposes the input module 20; Chain II $31_1$ to $31_n$ exposes the Huffman decoder module 30; Chain III $41_1$ to $41_n$ exposes the Huffman encoder module 40; Chain IV $51_1$ to $51_n$ exposes the output module 50; and Chain V $61_1$ to $61_n$ exposes the JBIG codec module. For total exposure, each flip-flop within a module is implemented with a scan cell that includes two flip-flops, as illustrated by FIG. 1. If total exposure is not necessary, only particular flip-flops are implemented with a scan cell that includes two flip-flops, as illustrated by FIG. 1.

Although FIG. 4 conceptually depicts a single scan chain within IC 100, it should be understood that module control logic interfaces 80A-n, similar to that illustrated in FIG. 2A, interconnect the respective module scan chain segments within the IC, as illustrated conceptually in FIG. 3. It is the module control logic interface 80 through its interaction with the master enable control register 300 and multi-tasking control register 200, as explained hereinafter, which is responsible for discarding data that does not need to be saved from a module.

Each chain holds state data defining the state of its associated module at a particular time and for a particular event (e.g., processing a piece of a task during multi-tasking). The chains are kept distinct so as to expose the individual modules so that state data therein can readily be saved/restored during multi-tasking and/or testing. As discussed in the background, this allows for preemptive multi-tasking, and thus, task switching is not restrained to specific boundaries. For this illustrative embodiment, each chain is extended to a multiple of 16 bits in length to make the bit alignment of data within words independent of the collection of modules being saved. State data may be shifted into the chains of the IC 100 serially through the Scan_Input primary input, which in the illustrative embodiment, is connected to the Scan_In input of the first scan cell of chain I $21_1$. Further, as is familiar to those skilled in the art, a Direct Memory Access (DMA) channel(s), not shown, may be coupled to the Scan_In input of the first scan cell of each chain $21_1$, $31_1$, $41_1$, $51_1$, and $61_1$, or to the first scan cell of select chains. The DMA channel(s) could be configured to aid in the restoring of state data from a storage device (e.g., Internal or External SRAM) into the scan chains. Such DMA interfaces would typically be more than one bit wide so there would also be a parallel to serial conversion mechanism between the DMA controller and the Scan_in. Since direct memory accesses would occur for more than just the start of the first scan chain, a simple manual register scheme may be utilized, allowing the application to repeatedly write to the register until all the required data has been entered. A similar technique may be implemented on the output side of the scan chains.

State data may be shifted out of the chains of the IC 100 serially through the Scan_Output primary output, which in the illustrative embodiment, is connected to the Scan_Out output of the last scan cell of chain V $61_n$. Further, as is familiar to those skilled in the art, a DMA channel(s) (not shown) may be coupled to the Scan Out output of the last scan cell of each chain $21_n$, $31_n$, $41_n$, $51_n$, and $61_n$, or to the last scan cell of select chains. The DMA channel(s) could be configured to aid in the saving of state data from the scan chains to a storage device (e.g., Internal or External SRAM).

In accordance with the illustrative embodiment, the Scan_Output of each scan cell of a scan chain, with the exception of the last scan cell of chains $21_n$, $31_n$, $41_n$, and $51_n$, is connected to the Scan_input of the next cell of the same scan chain. As shown in FIGS. 3 and 4, the Scan_Output of last scan cell of each scan chain $21_n$, $31_n$, $41_n$, and $51_n$, is operatively connected, through the module control logic 250 of the respective next module to the Scan_In input of the first scan cell of the next scan chain. The Scan_Output of the last scan cell of the last scan chain may be coupled to scan data storage logic. The module interface control logic depicted in the illustrative embodiment enables selective saving and restoring of module state and is responsible for discarding data from modules that do not need to be saved. In a system that can only perform a single fixed function a complex interface to the scan chain is not required. A single chain serial access configuration may have enough bandwidth for most applications to shift through all the required data while the current task is processing.

In an alternate embodiment, a module level interface, useful for systems that require faster swap times, may include logic that breaks the scan chain in each module of a system into multiple scan chains to allow true parallel access to the data in a module. Such a module level interface enables saving more than one bit of state per clock. In such an embodiment, when swapping tasks, if the task being preempted did not use a module but the task being resumed does, the module level interface provides a way to discard the useless serial state data being output by the module while the new state data is being shifted in. Also when swapping tasks, if the task being preempted used a module but the task being resumed does not, the module level interface provides a way to shift out the module's serial state data without loading in the serial data destined for another module, i.e. the module level interface allows the system to swap between tasks that use different combinations of modules while only saving and restoring the data that is necessary for each task. This minimizes the amount of data needed for multitasking and is particularly advantageous when the state is saved in an internal static RAM which is more expensive per byte than the host's DRAM.

As will be apparent to those skilled in the art, additional interfaces may be employed to improve the bandwidth of all of the chains, or to improve the bandwidth of select chains, during the saving/restoring of state data. For example, additional "glue logic" may be employed to improve the control and/or bandwidth of all of the chains or to improve the control and/or bandwidth of select chains during the saving/restoring of state data. For example, separate glue logic for restoring state data may be connected to the Scan_In input of the first scan cell of each chain $31_1$, $41_1$, $51_1$, and $61_1$; and/or separate glue logic for saving state data may be connected to the Scan_Out output of the last scan cell of each chain $21_n$, $31_n$, $41_n$, and $51_n$.

In an alternative embodiment, a parallel to serial interface may be used during the saving of state data from each module's chain so that the Scan_Output primary output includes a parallel connection to the last scan cell of each chain $21_n$, $31_n$, $41_n$, $51_n$, and $61_n$. Other combinations of interfaces, which will be apparent to those skilled in the art, may be employed which will achieve some of the advantages of the invention without departing from the spirit and scope of the invention.

In the illustrative embodiment, the management of state data for the chain of a particular module is accomplished by asserting and de-asserting the following inputs/outputs of the module: Scan_In_Enable; Scan_In_Ready; Scan_Out_Enable; Scan_Out_Ready; Swap; Enable; Reset_

Count; Save; and Restore. Furthermore, each module includes "glue logic" (not shown) which provides an interface between its inputs/outputs and its chain. Likewise, "glue logic" (not shown) is used to implement the master enable control register 300, the multi-tasking control register 200, and the control logic 80.

The Scan_In_Enable input of a module indicates when valid state data can be restored (e.g., shifted in, loaded in, etc.) to the module's chain. State data is shifted into a module's chain whenever there is: 1) a rising edge on the module's Clock input; 2) the module's Scan_In_Enable input is asserted; and 3) the module's Scan_In_Ready output is asserted. The Scan_Out Ready output of the control logic 80 is coupled to the Scan_In_Enable input of the input module 20. The Scan_Out_Ready output of the input module 20 is coupled to the Scan_In_Enable input of the Huffman decoder module 30. The Scan_Out_Ready output of the Huffman decoder module 30 is coupled to the Scan_In_Enable input of the Huffman encoder module 40. The Scan_Out_Ready output of the Huffman encoder module 40 is coupled to the Scan_In_Enable input of the output module 50. The Scan_Out_Ready output of the output module 50 is coupled to the Scan_In_Enable input of the JBIG codec module 60. The Scan_Out_Ready output of the JBIG codec module 60 is coupled to the Scan_In_Enable input of the control logic 80.

The Scan_In_Ready output of a module indicates that the module's chain is ready to accept state data. This signal is asserted when a module is in the process of discarding its own state data or when the module's Scan_Out_Enable input is asserted. The Scan_In_Ready output of the control logic 80 is coupled to the Scan_Out_Enable input of the input module 20. The Scan_In_Ready output of the input module 20 is coupled to the Scan_Out_Enable input of the Huffman decoder module 30. The Scan_In_Ready output of the Huffman decoder module 30 is coupled to the Scan_Out_Enable input of the Huffman encoder module 40. The Scan_In_Ready output of the Huffman encoder module 40 is coupled to the Scan_Out_Enable input of the output module 50. The Scan_In_Ready output of the output module 50 is coupled to the Scan_Out_Enable input of the JBIG codec module 60. The Scan_In_Ready output of the JBIG codec module 60 is coupled to the Scan_Out_Enable input of the control logic 80.

The Scan_Out_Enable input of a module indicates to the module when state data can be shifted out of its chain. Data is shifted out of a module's chain whenever there is: 1) a rising edge on the module's Clock input; 2) the module's Scan_Out_Enable input is asserted; and 3) the module's Scan_Out_Ready output is asserted.

The Scan_Out_Ready output of a module indicates that the module is ready to output state data. The Scan_Out_Ready output is asserted when a module is in the process of discarding its state data because the module's Save input is not asserted, or when its Scan_In_Enable input is asserted. The Scan_Out Ready output of the control logic 80 is coupled to the Scan_In_Enable input of the input module 20. The Scan_Out_Ready output of the input module 20 is coupled to the Scan_In_Enable input of the Huffman decoder module 30. The Scan_Out_Ready output of the Huffman decoder module 30 is coupled to the Scan_In_Enable input of the Huffman encoder module 40. The Scan_Out_Ready output of the Huffman encoder module 40 is coupled to the Scan_In_Enable input of the output module 50. The Scan_Out_Ready output of the output module 50 is coupled to the Scan_In_Enable input of the JBIG codec module 60. The Scan_Out_Ready output of the JBIG codec module 60 is coupled to the Scan_In_Enable input of the control logic 80.

The Swap input of a module, when asserted during a rising edge at the module's Clock input, prompts each scan cell of the module's chain to swap data. That is, for each scan cell of the module's chain, the data in the active D flip-flop 10 is exchanged with the data in the scan D flip-flop 11, as was previously discussed with reference to FIG. 1. The Swap input of each module is connected to the Swap output(s) of the control logic 80. The Swap input of a module is directly connected (e.g., no "glue logic") to each scan cell of the module's chain.

The Enable input of a module controls processing within the module. When a module's Enable input is asserted, the module performs its normal operation. When a module's Enable input is de-asserted, the module completes all currently active transactions with other modules and de-asserts all requests for new transactions; thus, making it safe to save, swap, or restore state data. Proper control of the Enable input prevents tasks from being interrupted and restarted out of context. The Enable input of each module is connected to a separate bit in the master enable control register 300.

The Reset_Count input of a module, when asserted during a rising edge at the module's Clock input, resets the "shift count" value of the module's chain. The "shift count" value of a module's chain is employed by the control logic 80 to determine how many bits to discard in the event that the data within a module's chain is not saved and restored at the same time. The Reset_Count input of each module is connected to the Reset_Count output(s) of the control logic 80.

Save is a module input that, when asserted, causes the module's state to be saved. What happens when Save is not asserted is a function of what Restore is set to do. N output shifts are suppressed only when Restore is asserted where n is the number of bits of scan data in the module (e.g., the number of scan cells in the module's chain). If neither Save nor Restore is asserted, data is simply routed around the module. The Save signal of each module is connected to a separate bit in the multitasking control register 200, which can be controlled by an application via the Control Data Interface.

Restore is a module input that, when asserted, causes the module's state to be restored. What happens when Restore is not asserted is a function of assertion of Save. If Save is asserted but Restore is not, Scan_Out_Ready is asserted until the module's state has been shifted out and then the data from Scan_Input is directed to Scan_out. The Restore signal of each module is connected to a separate bit in the multitasking control register 200, which can be controlled by an application via the Control Data Interface.

For the purposes of describing the illustrative embodiment, the term "application" refers to any process capable of communicating with the Control Data Interface, as described herein. Typically, an application will be implemented as a series of instructions executing on a processor or microprocessor associated with the integrated circuit on which the invention is implemented.

Thus, by controlling the multi-tasking control register 200, an application can save, restore, or discard state data on a module-by-module basis, eliminating the need to save and restore the state data of modules that are not being used. This is particularly useful in systems where the operation of some modules is mutually exclusive.

Figure 5:
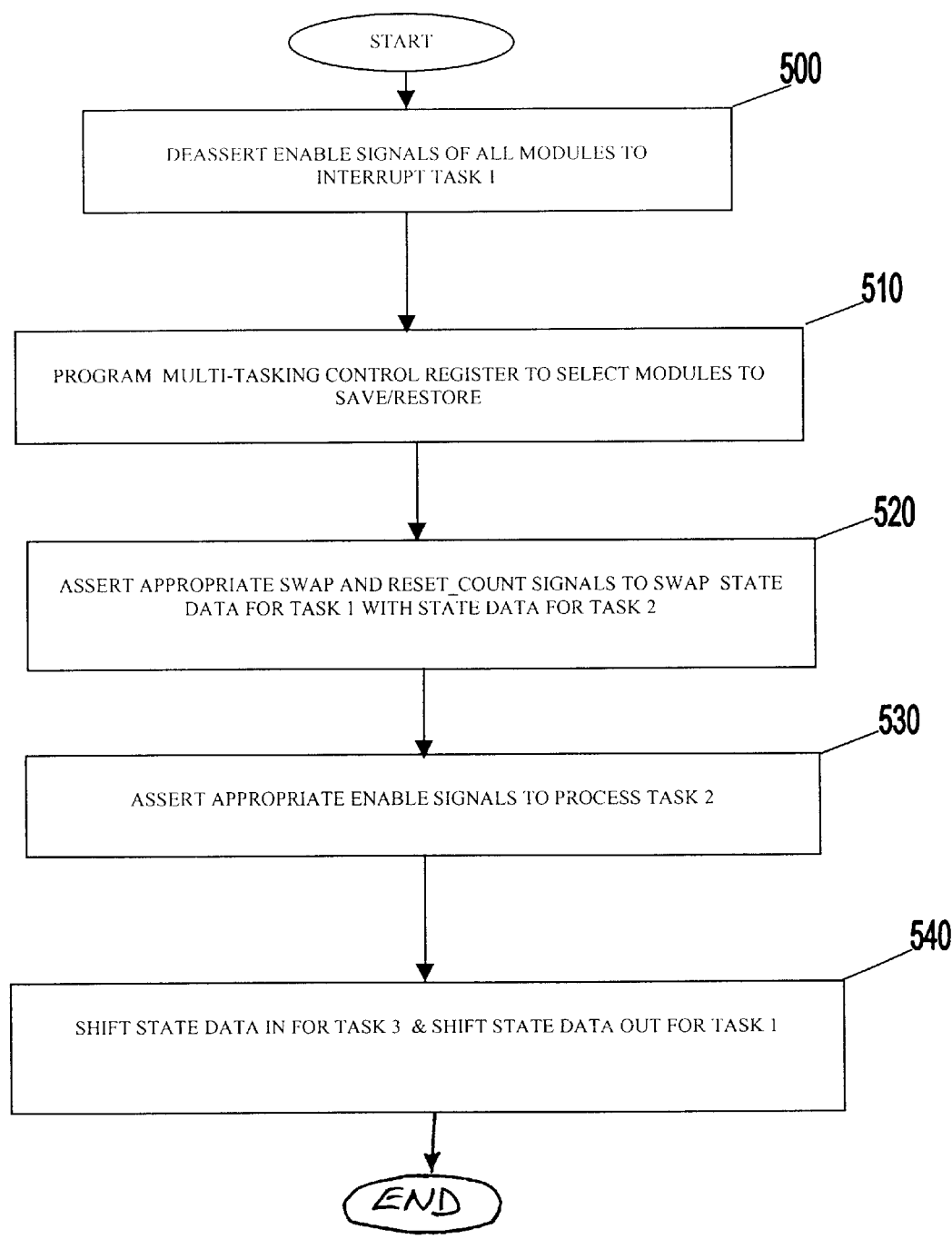
FIG. 5 is a flow chart diagram illustrating the steps involved when switching from one task to another task.

FIG. 5 is a flow chart which illustrates the process steps for: switching from one task, Task 1, to another task, Task 2; saving the state data for Task 1; and restoring, or loading, the state data for another task, Task 3. Refer back to FIG. 4 for all references to the Control Data Interface, the control logic 80, the multi-tasking control register 200, the Internal SRAM, the External SRAM, and the master enable control register 300 of the IC 100. Note that for the purposes of FIG. 5, an application interfaces with the IC 100 via the Control Data Interface. The Control Data Interface is coupled directly to the control logic 80 and indirectly (e.g., through "glue logic" in the control logic 80) to the multi-tasking control register 200 and the master enable control register 300. In addition, for the purpose of describing the process flow illustrated in FIG. 5 and FIG. 5A it is assumed that the state data for Task 1 initially resides the active flip-flops 10 of the scan cells within the module(s) of IC 100, and, further that the state data for Task 2, initially resides in the scan flipflops 11 of the scan cells of the module(s) of IC 100.

First, in accordance with step 500, the application interrupts the processing of Task 1 by de-asserting the Enable inputs of each module via the Control Data Interface. This causes the modules to stop processing, and consequently, allows any state machines that are associated with Task 1 and in the middle of interactions to finish processing.

Next, at step 510, the application selects which modules containing state data, if any, to save and restore by programming the multi-tasking control register 200 with an appropriate value so that the correct Save and Restore inputs are asserted and de-asserted. To do this, the application examines the dedicated bits in the multi-tasking control register 200 that are associated with each module's Save and Restore inputs. Then, the application makes inquiries regarding the prior use and projected use of each module, as discussed below.

Specifically, the application determines on a module-by-module basis whether a module was in use before the last Swap. If the module was in use before the last Swap, then the module's Save input is asserted. If the module was not in use before the last Swap the module's Save input is de-asserted. Similarly, the application determines on a module-by-module basis whether a module will be used after the next Swap. If the module will be used after the next Swap, then the module's Restore signal is asserted. If the module will not be used after the next Swap, then the module's Restore signal is de-asserted.

If a module was not in use before the last swap and will not be in use after the next swap, the application, i.e. the process controlling use of the module, must set the Save and Restore signals for the module inactive. This causes the output scan control signals to be logically connected to the input scan control signals to cause scan data to flow around the module.

If a module was not in use before the last swap and will be in use after the next swap, the application must set the Save signal inactive and the Restore signal active. This causes the Scan_out ready signal to be deasserted and the Scan_In_Ready signal to be asserted for the first n shifts, where n is the number of bits of state in the module. This discards the module's data so it will not be stored while shifting new data into the scan chain.

If a module was being used before the last swap and will not be in use after the next swap, the application must set the Save signal active and the Restore signal inactive. This causes the module's state data to be saved without shifting in new state by setting the Scan_Out_ready signal active and setting the Scan_In_Ready signal active until a module's worth of data has been shifted out. After the state has been saved, normal shift control is resumed but Scan_Out data is taken directly from Scan_In to prevent data destined for other modules from being lost in the module. If a module was being used before the last swap and will still be used after the next swap, the application must set the Save and Restore signals active. This causes the scan chain to be connected to the adjacent modules.

Next, as illustrated by step 520, the application causes the control logic 80 to assert the appropriate Swap and Reset_Count inputs to swap the state data in the scan cells of the chains. As previously described with reference to FIG. 1, this causes the state data for Task 1, which is initially in a scan cell's active flip-flop 10, to be swapped with the state data for Task 2, which is initially in the scan cell's scan flip-flop 11. In addition to swapping the state data for Task 1 with the state data for Task 2, the application resets the bit counters (not shown) within the modules.

Then, as shown by step 530, with the state data of Task 2 now in the active flip-flops 10 of the scan cells, the application starts or resumes processing Task 2 by writing the appropriate bit pattern to the master enable control register 300. As illustrated by step 540, while the IC 100 is processing Task 2, the state of the next restored or initiated task, Task 3, is shifted into the Scan_In signal of Chain I (e.g., via the Scan_Input primary input), and the data to be saved from Task 1 is shifted out from the Scan_Out signal of Chain IV (e.g., via the Scan_Output primary output).

FIG. 5 illustrates the simultaneous swapping of state data in the scan cells of a module's chain, as was previously discussed with respect to FIG. 1. Also, step 540 illustrates that by simultaneously shifting in state data for a new task (e.g., Task 3) and shifting out state data for a previous task (e.g., Task 1), state data is simultaneously saved and restored. Although this is the most time efficient manner of swapping state data and switching tasks, there may be times where the state data for a subsequent task (e.g., Task 3) is not known when saving the state data for a previous task (e.g., Task 1). In such a case, it is possible to save the state data for the previous task and then, restore the state data for the subsequent task later on, once it becomes available.

One way in which an application can save state data from a previous task and then, later on, restore state data for a subsequent task is to program the multi-tasking control register 200 to save the state data for the previous task without restoring any new state data. Later on, when the state data for the subsequent task is available, the application can reset the multi-tasking counters and then, program the multitasking control register to restore, or load, the state data for the subsequent task.

For a system, especially one that is densely populated with buried modules, the present invention improves the management of state data by employing enhanced scan chain logic to expose the system's modules. By exposing the system's modules, the enhanced scan chain logic creates a system wherein state data is readily accessible. The invention enables automatic task switching which can include swapping the state data of the two flip-flops of a scan cell, or of a chain of scan cells, for a module. This allows for preemptive multi-tasking by creating a system where state data is readily accessible. In addition to offering an improvement in the area of multi-tasking, the exposure provided by the enhanced scan chain logic also improves the testability of a system.

Figure 6:
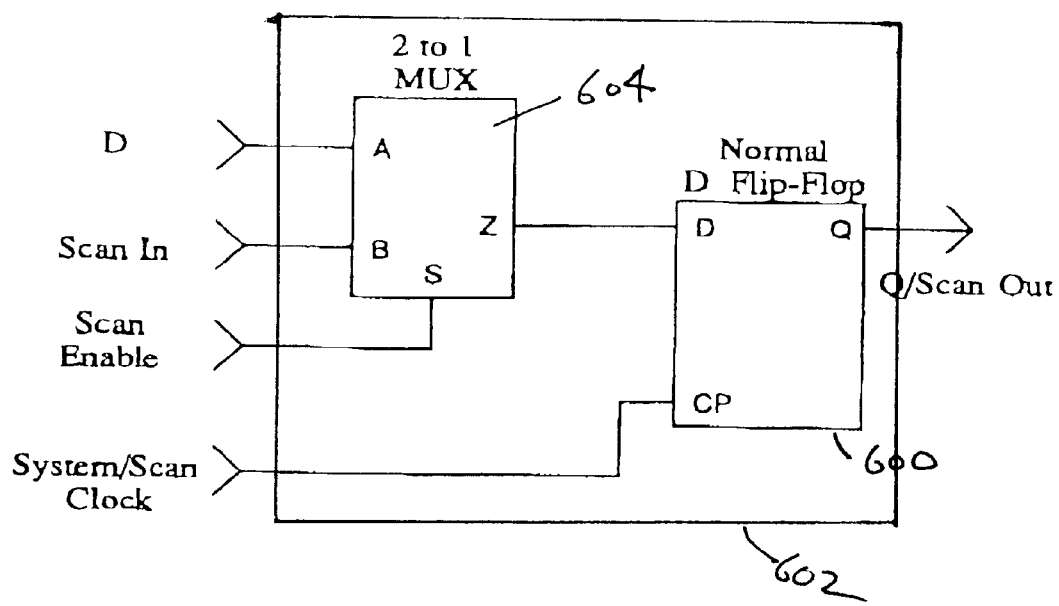
FIG. 6 is a block diagram of a prior art scan cell.

The present invention has been described with reference to an illustrative embodiment that utilizes and improved scan cell design which includes both an active flip-flop and a scan flip-flop as previously described. The inventive concepts of swapping in/out state data to facilitate multitasking in a module may be also applied to legacy scan cell designs which have a single flip-flop per scan cell, such as that illustrated in FIG. 6. In FIG. 6, a legacy scan cell 602 comprises a single flip-flop 600 per scan cell and mux logic 604. Data input (D), Scan_In, and Scan_Enable signals are coupled to mux logic 604. The output signal (Z) of mux logic 604 is connected to the Data input (D) of flip-flop 600 while a System/Scan Clock signal is also coupled to flip-flop 600, as illustrated. A plurality of such scan cells 602 may be coupled to form a scan chain similar to those illustrated herein in a manner reasonably understood by those skilled in the art.

Figure 7:
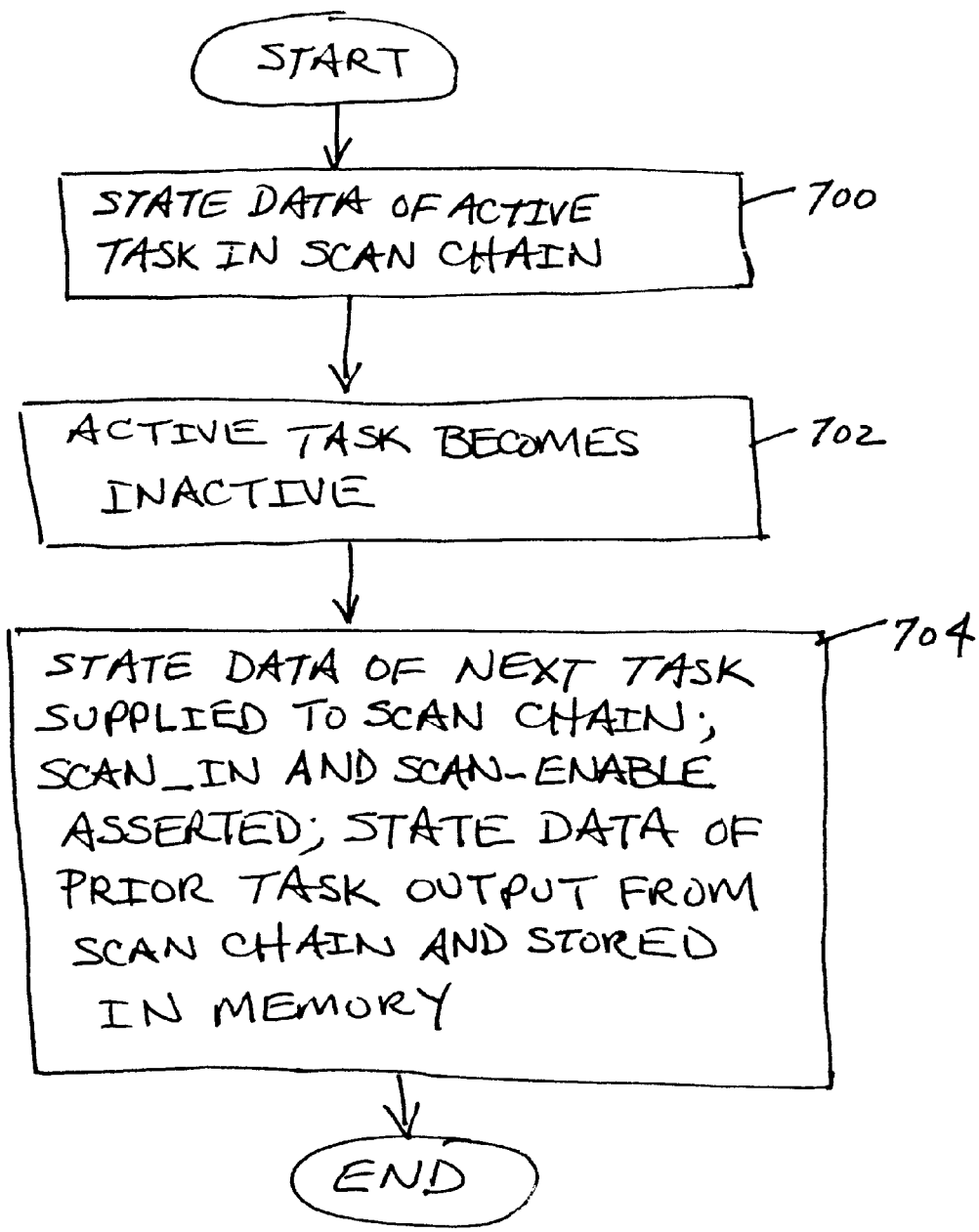
FIG. 7 is a flow chart diagram illustrating the steps involved when switching from one task to another task with a scan chain of legacy scan cells as illustrated in FIG. 6.

The process steps for swapping of state data from legacy scan chains to facilitate multitasking is illustrated in FIG. 7. Initially, the state data for the currently active task resides within the single flip-flop 600 of the scan cells 602 of the legacy scan chain, as illustrated in step 700. At some point processing of the active task within a module terminates or becomes inactive as directed by the application or control process, as illustrated in step 702. The application or control process asserts the Scan_IN and Scan Enable signals to each scan cells 602, as illustrated in step 704, while the state data of the next task is supplied to the Data input of the first scan cell in the legacy scan chain. Simultaneously, the state data of the last task emerges from the Q/ScanOut of the last scan cell in the legacy scan chain and is stored in a memory for future use or discarded, as also illustrated in step 704. Accordingly, the state data of the inactive task is simultaneously shifted out of the scan chain while the state data of the next task is simultaneously shifted into the legacy scan chain. When processing of the current task is complete the state data of the prior task or another tacks can be swapped in a similar manner using the same technique. The use of multi-tasking control register 200 with the legacy scan chain in a manner similar to that previously described may further assist in the efficiency of the swapping processes.

The foregoing description and drawings disclose specific details for illustrative and alternative embodiments of the present invention and should not be construed as a limitation of the inventive concept. It will be recognized by those skilled in the art that the present invention may be practiced using alternative implementations, including different memory, flip-flop, and logical component types, etc. Although an exemplary embodiment of the invention has been disclosed, it will be apparent to those skilled in the art that various changes and modifications can be made which will achieve some of the advantages of the invention without departing from the spirit and scope of the invention. It will be obvious to those reasonably skilled in the art that other elements performing the same functions may be suitably substituted. Further, aspects such as the proposed scan cell architecture and the proposed method of control, as well as other modifications to the inventive concept, are intended to be covered by the appended claims.

What is claimed is:

1. A scan cell for storing state data associated with more than one task comprising:
    a data memory device configured to hold state data and having a data input terminal, a data output terminal, and a control input terminal;
    a scan memory device configured to hold state data and having a scan input terminal, a scan output terminal, and the control input terminal; and
    control logic coupled to the data memory device and the scan memory device and configured to initiate swapping of the state data in the data memory device with the state data in the scan memory device upon a predetermined event.

2. The apparatus of claim 1 wherein the control logic comprises a multiplexer coupled to the data memory device and the scan memory device.

3. The apparatus of claim 1 wherein the predetermined event comprises one of a first task having data stored in the scan cell going inactive and a second task having data stored in the scan cell going active.

4. The apparatus of claim 1 in combination with module control logic having a swap output terminal for coupling to the control input terminal of at least one scan cell.

5. The apparatus of claim 1 in combination with a second scan cell so that the data input terminal, and scan input terminal of a first of the scan cells are coupled to the data output terminal and scan output terminal, respectively, of a second of the scan cells.

6. The apparatus of claim 5 in combination with module control logic having a swap output terminal for coupling to the control input terminals of at least the first and second scan cells.

7. A scan chain comprising:
    a plurality of scan cells, each scan cell having first and second memory devices capable of holding data and interconnected to allow swapping of data between the memory devices,
    the plurality of scan cells being serially interconnected to enable propagation of data sequentially through the first memory devices of the scan cells;
    the plurality of scan cells being serially interconnected to enable propagation of data sequentially through the second memory devices of the scan cells; and
    control logic configured to initiate swapping of the data between the first and second memory devices upon the occurrence of a predetermined event.

8. The apparatus of claim 7 wherein the predetermined event comprises one of a first task having data stored in the scan cell going inactive and a second task having data stored in the scan cell going active.

9. A method for managing state data in a system having a scan chain, the scan chain being configured to hold state data associated with a module of the system, the scan chain comprising a plurality of scan cells, the scan cells comprising data memory device and scan memory devices, the method comprising:
    (A) receiving a swap signal at a control input terminal of the scan cells;
    (B) swapping, in response to the swap signal, state data in the data memory device of each scan cell with state data in the scan memory device of each scan cell; and
    (C) saving the state data from the scan memory device of 16 for us from each scan cell to a storage source; and
    (D) loading new state data into the scan memory device of each scan cell.

10. The method of claim 9 wherein step (C) further comprises receiving a save signal.

11. The method of claim 9 wherein step (D) further comprises receiving a restore signal.

* * * * *

UNITED STATES PATENT AND TRADEMARK OFFICE
CERTIFICATE OF CORRECTION

PATENT NO. : 6,691,268 B1
DATED : February 10, 2004
INVENTOR(S) : Douglas Chin

It is certified that error appears in the above-identified patent and that said Letters Patent is hereby corrected as shown below:

<u>Column 18,</u>
Line 57, please delete "16 for us from".

Signed and Sealed this

Twentieth Day of April, 2004

JON W. DUDAS
*Acting Director of the United States Patent and Trademark Office*

UNITED STATES PATENT AND TRADEMARK OFFICE
CERTIFICATE OF CORRECTION

PATENT NO.     : 6,691,268 B1
DATED          : February 10, 2004
INVENTOR(S)    : Douglas Chin It is certified that error appears in the above-identified patent and that said Letters Patent is hereby corrected as shown below:

<u>Column 18,</u>
Line 57, please delete "16 for us from".

Signed and Sealed this

Fifteenth Day of June, 2004

JON W. DUDAS
*Acting Director of the United States Patent and Trademark Office*